(12) United States Patent
Chen et al.

(10) Patent No.: US 12,281,849 B2
(45) Date of Patent: Apr. 22, 2025

(54) HEAT DISSIPATION DEVICE

(71) Applicant: COOLER MASTER CO., LTD., Taipei (TW)

(72) Inventors: Kui-Yen Chen, Taipei (TW); Shan-Yin Cheng, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 74 days.

(21) Appl. No.: 17/983,262

(22) Filed: Nov. 8, 2022

(65) Prior Publication Data

US 2023/0063953 A1 Mar. 2, 2023

Related U.S. Application Data

(62) Division of application No. 17/220,646, filed on Apr. 1, 2021, now Pat. No. 11,525,632.

(30) Foreign Application Priority Data

Dec. 25, 2020 (TW) .................................. 109146305

(51) Int. Cl.
  *F28D 1/03*   (2006.01)
  *F28D 15/02*  (2006.01)
  *F28D 21/00*  (2006.01)

(52) U.S. Cl.
  CPC ........ *F28D 1/0316* (2013.01); *F28D 15/0266* (2013.01); *F28D 2021/0029* (2013.01); *F28D 2021/0031* (2013.01); *F28F 2215/06* (2013.01); *F28F 2250/10* (2013.01)

(58) Field of Classification Search
  CPC .............. F28D 15/0233; F28D 15/0266; F28F 2215/06; F28F 2250/10; H05K 7/20336; H05K 7/20927
  See application file for complete search history.

(56) References Cited

U.S. PATENT DOCUMENTS

| | | | |
|---|---|---|---|
| 2006/0283579 A1* | 12/2006 | Ghosh ................. | F28D 15/0266 257/E23.098 |
| 2008/0264611 A1 | 10/2008 | Chang et al. | |
| 2017/0102190 A1* | 4/2017 | Anderl ...................... | F28F 3/02 |
| 2018/0266738 A1* | 9/2018 | Li ........................... | F25B 39/02 |

(Continued)

FOREIGN PATENT DOCUMENTS

| | | | |
|---|---|---|---|
| CN | 108336048 B | | 7/2018 |
| CN | 110351991 A | * | 10/2019 |
| CN | 212179669 U | | 12/2020 |

(Continued)

*Primary Examiner* — Eric S Ruppert
(74) *Attorney, Agent, or Firm* — Merchant & Gould P.C.

(57) ABSTRACT

A heat dissipation device is configured for a working fluid to flow therethrough. The heat dissipation device includes a base, at least one heat dissipation fin, and at least one fluid replenisher. The base has at least one internal channel configured for the working fluid to flow therethrough. The at least one heat dissipation fin having an extension channel and an inlet and an outlet is in fluid communication with the extension channel. The at least one heat dissipation fin is inserted into one side of the base, and the extension channel is communicated with the at least one internal channel through the inlet and the outlet. The at least one fluid replenisher is connected to at least one internal channel.

13 Claims, 4 Drawing Sheets

(56) References Cited

U.S. PATENT DOCUMENTS

2019/0353430 A1   11/2019   Narasimhan et al.

FOREIGN PATENT DOCUMENTS

| EP | 2426780 A2 | 3/2012 |
| EP | 2677261 A1 | 12/2013 |
| JP | 2015169420 A | 9/2015 |
| TW | 201738356 A | 11/2017 |
| WO | 2020060482 A1 | 3/2020 |

\* cited by examiner

HEAT DISSIPATION DEVICE

CROSS-REFERENCE TO RELATED APPLICATIONS

This non-provisional application claims priority under 35 U.S.C. § 119(a) on Patent Application No(s). 109146305 filed in Taiwan, R.O.C. on Dec. 25, 2020, the entire contents of which are hereby incorporated by reference.

TECHNICAL FIELD

This disclosure relates to a heat dissipation device, especially to a liquid-cooled heat dissipation device.

BACKGROUND

The increase in waste heat generated as the speed and frequency in electronic components are increasing. The typical heat sinks with fins made by aluminum extrusion or die-casting process have very limited surface areas, and thus its convection of the surrounding air is not as expected, even a fan is added. For this reason, the heat-sink cooling approaches are no longer suitable for dealing with the growing cooling demand.

SUMMARY

Accordingly, this disclosure provides a heat dissipation device with improved heat dissipation efficiency.

According to one or more embodiment of this disclosure, a heat dissipation device configured for a working fluid to flow therethrough comprises: a base having at least one internal channel configured for the working fluid to flow therethrough; at least one heat dissipation fin having an extension channel and an inlet and an outlet in fluid communication with the extension channel, wherein the at least one heat dissipation fin is inserted into one side of the base, and the extension channel is in fluid communication with the at least one internal channel and the outlet through the inlet; and at least one fluid replenisher connected to at least one internal channel.

According to the heat dissipation devices discussed in the previous embodiments, the internal channel of the base and the extension channel of the heat dissipation fin are in fluid communication with each other, thus working fluid will naturally circulate therethrough when absorbing heat, forming a three-dimensional heat transfer over the base as well as the heat dissipation fin. As such, the overall heat dissipation efficiency is improved.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
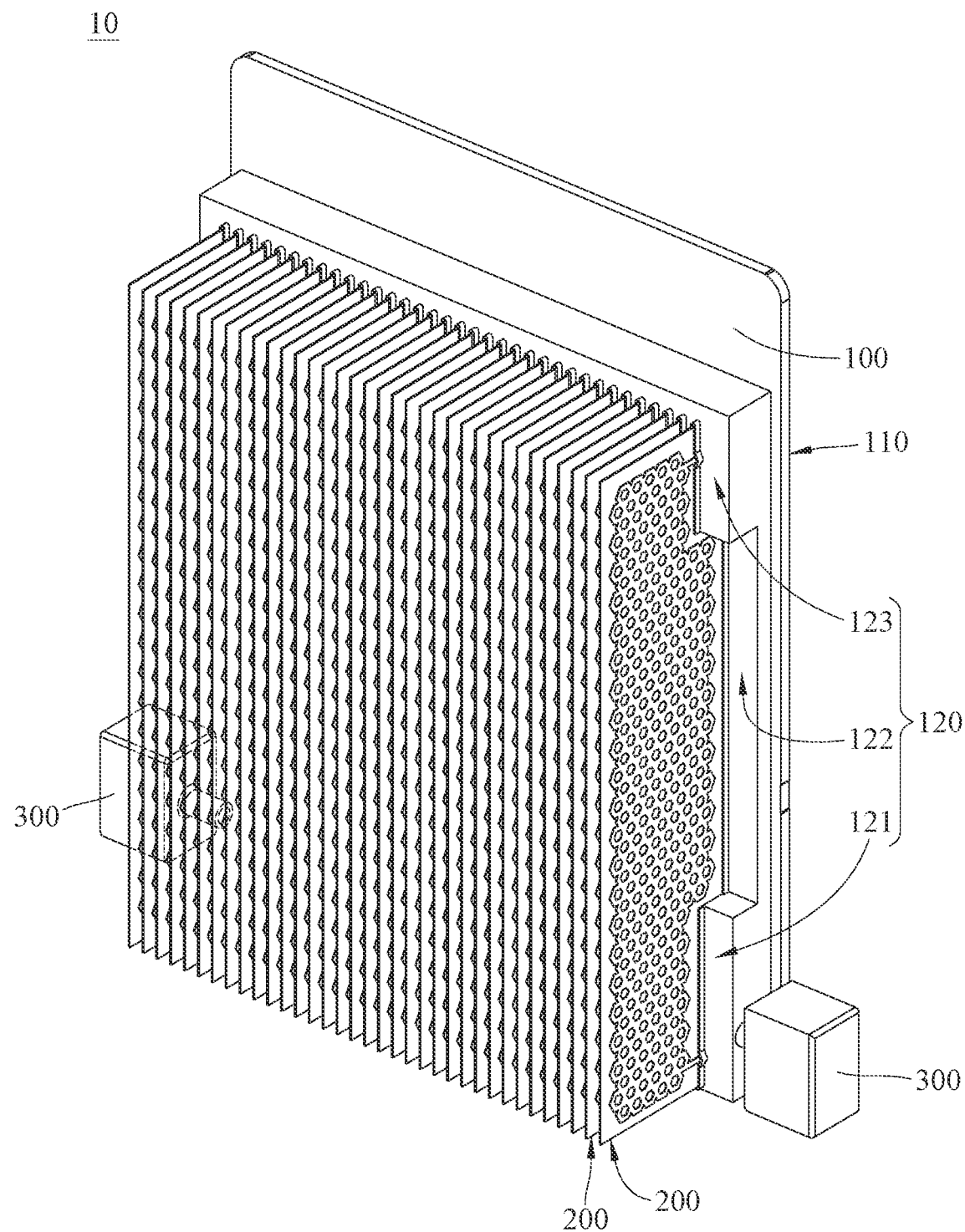
FIG. 1 is a perspective view of a heat dissipation device according to the first embodiment of the present disclosure.
Figure 2:
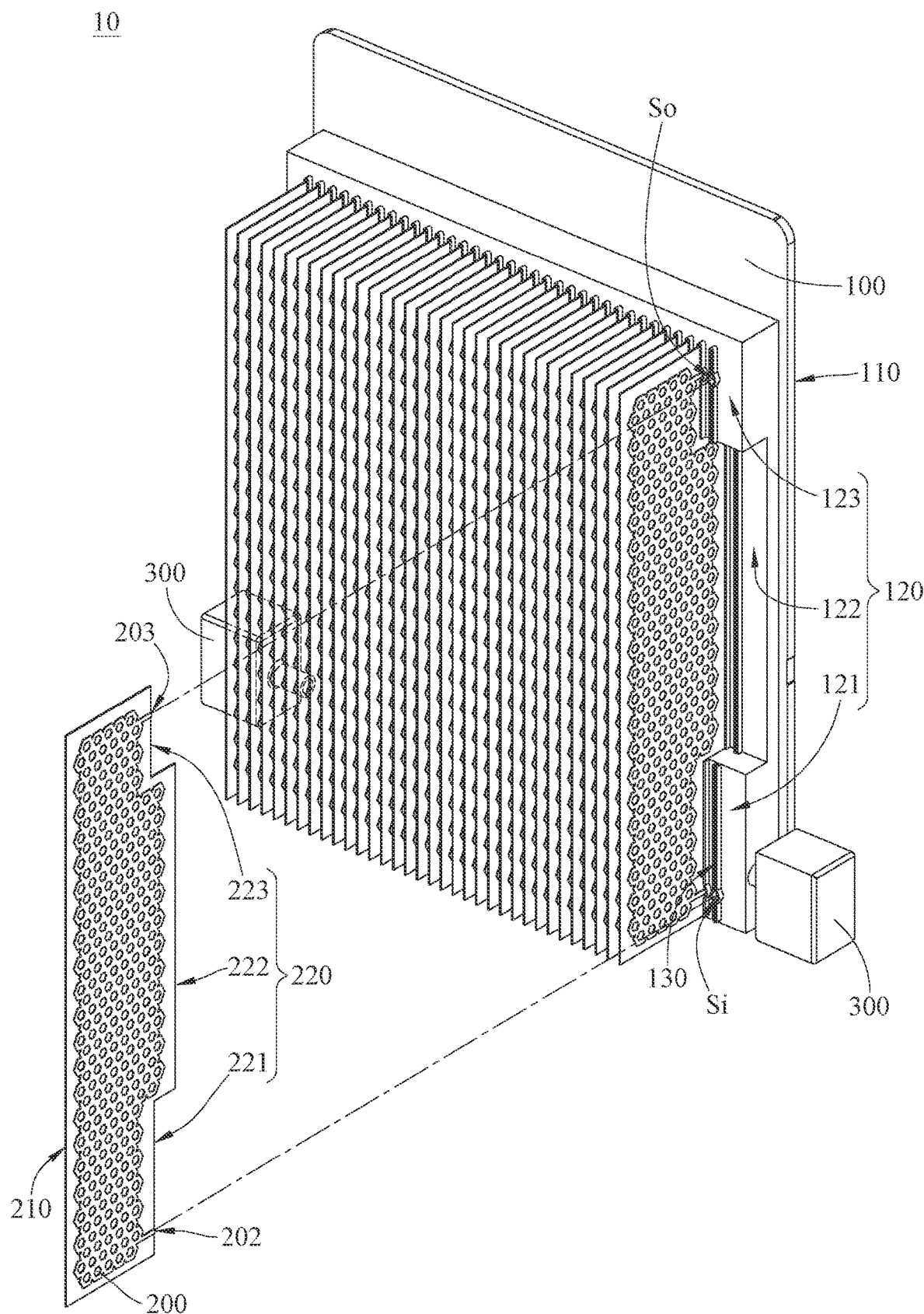
FIG. 2 is an exploded view of the heat dissipation device in FIG. 1.
Figure 3:
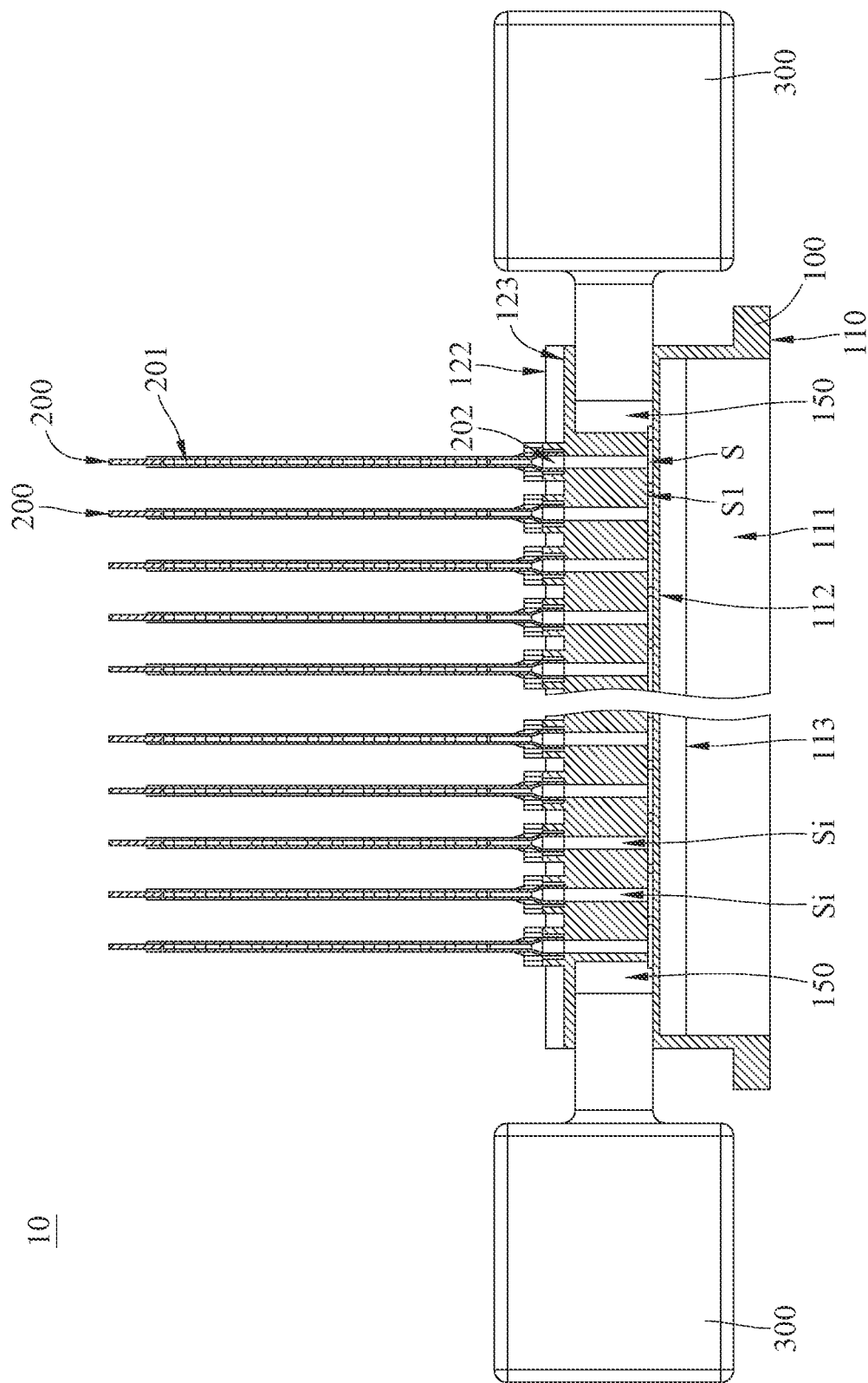
FIG. 3 is a partial cross-sectional view of the heat dissipation device FIG. 1.
Figure 4:
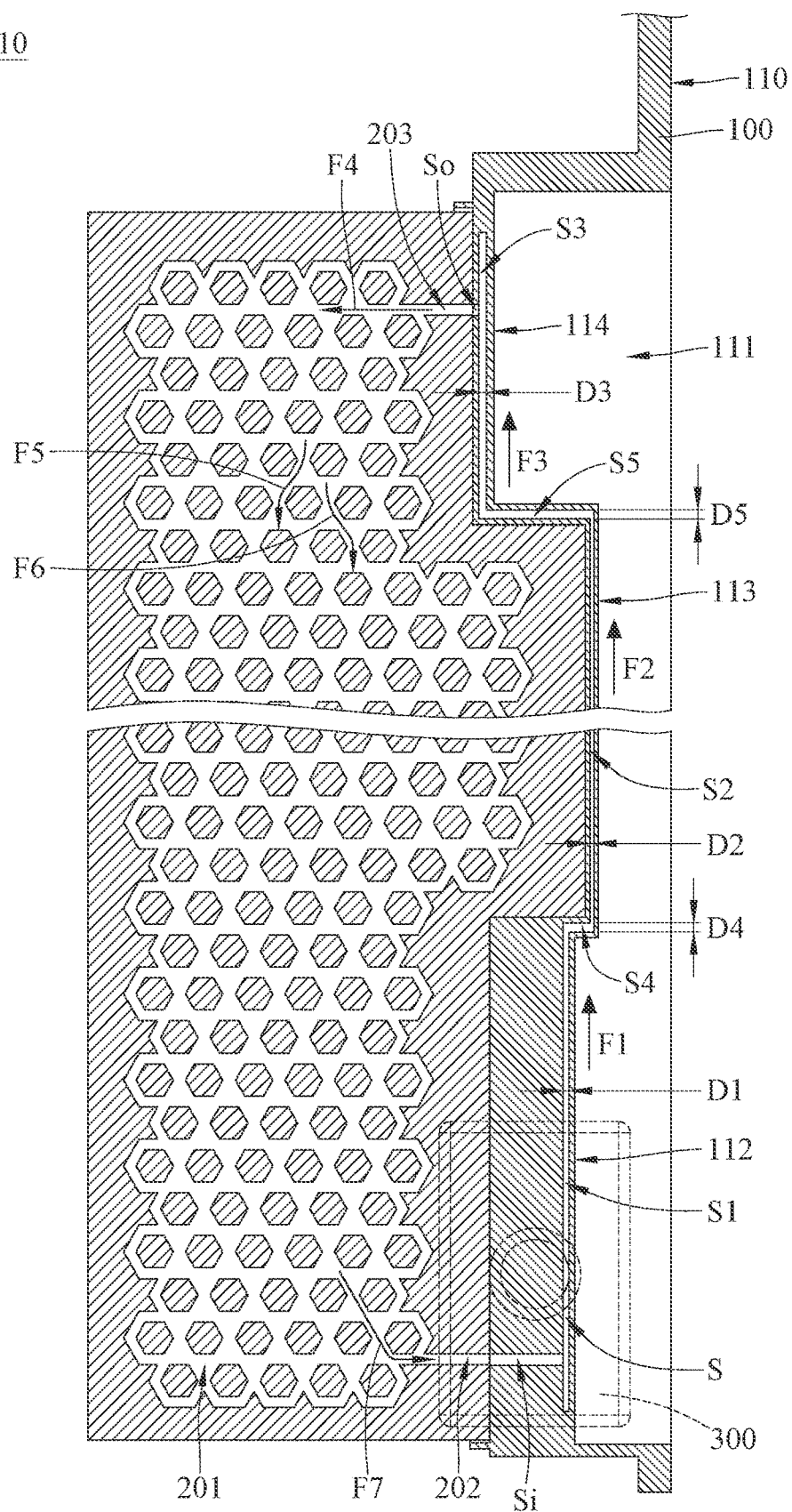
FIG. 4 is another cross-sectional view of heat dissipation device in FIG. 1.

Please refer to FIGS. 1 to 4, where FIG. 1 is a stereoscopic view of a heat dissipation device 10 according to the first embodiment of the present disclosure, FIG. 2 is an exploded view of the heat dissipation device 10, FIG. 3 is a partial cross-sectional view of the heat dissipation device 10, and FIG. 4 is another partial cross-sectional view of the heat dissipation device 10.

The heat dissipation device 10 is configured for a working fluid (not shown) to flow therethrough. The working fluid may be water, refrigerant, or any other suitable coolant. The heat dissipation device 10 comprises a base 100, a plurality of heat dissipation fins 200, and two fluid replenishers 300.

The base 100 has at least one internal channel S. The internal channel S is configured for the working fluid (not shown) to flow therethrough. In detail, the base 100 has a first side surface 110, a second side surface 120, an accommodation recess 111, and a plurality of assembling slots 130. The accommodation recess 111 is located at the first side surface 110 and is configured for accommodating a heat source (not shown). The second side surface 120 faces away from the first side surface 110. The assembling slots 130 are located at the second side surface 120. In this embodiment, the base 100 may further have two join slots 150 in fluid communication with the internal channel S.

The heat dissipation fins 200 each have an extension channel 201, and an outlet 202 and an inlet 203 in fluid communication with the extension channel 201. The extension channel 201 may be, for example, in a grid shape. The heat dissipation fins 200 are inserted into one side of the base 100, and each of the extension channels 201 is in fluid communication with at least one of the internal channels S through the outlet 202 and the inlet 203.

In this embodiment, the second side surface 120 has a first holding part 121, a second holding part 122, and a third holding part 123. Two opposite sides of the second holding part 122 are respectively connected to the first holding part 121 and the third holding part 123, the second holding part 122 is located closer to the first side surface 110 than the first holding part 121, and the first holding part 121 is located closer to the first side surface 110 than the third holding part 123. The assembling slots 130 are arranged over the first holding part 121, the second holding part 122, and the third holding part 123. The heat dissipation fins each 200 has a cold side 210 and a hot side 220 located opposite to each other. The hot side 220 has a first part 221, a second part 222, and a third part 223. The first part 221, the second part 222, and the third part 223 respectively contact the first holding part 121, the second holding part 122, and the third holding part 123.

The fluid replenishers 300 are respectively disposed at the join slots 150 so that the fluid replenishers 300 are located at the two opposite sides of the base 100 and are in fluid communication with the internal channel S. The heat transfer of the working fluid (not shown) occurs at the internal channel S and the extension channel 201 so that the working fluid can circulate throughout the internal channel S and the extension channel 201. Since the heat transferring of the working fluid happens naturally, the circulation can occur with the absence of capillary structure.

Note that the quantities of the assembling slots 130 and the heat dissipation fins 200 can be modified as required; for example, the of other embodiments may only have one assembling slot 130 and one heat dissipation fin 200. Furthermore, in this embodiment, each of the quantities of two join slots 150 and the fluid replenishers 300 are two, but they can be modified as required; for example, the other embodiments may have only one join slots 150 and one fluid replenisher 300.

As shown in FIG. 4, the internal channel S of the embodiment has an inlet part Si, an outlet part So, a first channel part S1, a second channel part S2, a third channel part S3, a first connecting part S4, and a second connecting part S5. The first channel part S1 and the third channel part S3 are respectively in fluid communication with the inlet part Si and the outlet part So, and two opposite ends of the second channel part S2 are respectively in fluid communication with the first channel part S1 and the third channel part S3 via the first connecting part S4 and the second connecting part S5, the second channel part S2 is located closer to the first side surface 110 than the first channel part S1, and the first channel part S1 is located closer to the first side surface 110 than the third channel part S3. The fluid replenisher 300 is in fluid communication with the first channel part S1 to keep the capacity of the working fluid in the internal channel S and the extension channel 201.

The heat dissipation device 10 may be placed vertically during operation. In this position, the second channel part S2 is located higher than the first channel part S1, and the third channel part S3 is located higher than the second channel part S2. That is, the horizontal height of the second channel part is higher than the horizontal height of the first channel part, and the horizontal height of the third channel part is higher than the horizontal height of the second channel part. In addition, the flow resistance of the first channel part S1 is smaller than that of the inlet part Si and the outlet part So, and the fluid pressure in the extension channel 201 of the heat dissipation fin 200 is larger than that in the internal channel S of the base 100, thus the working fluid will be circulated as indicated by the arrows F1-F7 due to the influences of the natural heat convection and the force of gravity. The above comparisons of the flow resistance are determined by comparing the sizes of the cross-sections of the channels. In one example, the horizontal cross-section of the first channel part S1 is greater than the vertical cross-section of the inlet part Si and the outlet part So, thus the flow resistance of the first channel part S1 is determined to be smaller than that of the inlet part Si and the outlet part So.

In the embodiment, the fluid replenisher 300 is in fluid communication with the first channel part S1 via the first channel part S1; that is, the fluid replenisher 300 is close to the lower part of the internal channel S, but the location of the fluid replenisher 300 may be changed as required. In other embodiment, the fluid replenisher 300 may be arranged to be in fluid communication with the third channel part S3 so as to be located close to the upper part of the internal channel S.

In this embodiment, the extension directions of the first channel part S1, the second channel part S2, and the third channel part S3 are different from the extension directions of the first connecting part S4 and the second connecting part S5. For instance, the extension directions of the first channel part S1, the second channel part S2 and the third channel part S3 are substantially perpendicular to the extension directions of the first connecting part S4 and the second connecting part S5. The term "substantially" may or may not import a sense of an approximation to the phrases. Note that the extension directions of the first channel part S1, the second channel part S2, the third channel part S3, the first connecting part S4, and the second connecting part S5 all can be modified as required. In other embodiment, the first connecting part and the second connecting part may be at an acute angle to the first channel part, the second channel part, the third channel part.

In this embodiment, the base 100 has a first surface 112, a second surface 113, and a third surface 114 which are located at the bottom of the accommodation recess 111. The first surface 112, the second surface 113, and the third surface 114 respectively correspond to the first channel part S1, the second channel part S2, and the third channel part, two opposite sides of the second surface 113 are connected to the first surface 112 and the second surface 113, the second surface 113 is located closer to the first side surface 110 than the first surface 112, and the first surface 112 is located closer to the first side surface 110 than the third surface 114. The first surface 112, the second surface 113, and the third surface 114 are respectively for being in thermal contact with different heat source.

In this embodiment, a width D1 of the first channel part S1 is larger than a width D2 of the second channel part S2, and a width D3 of the third channel part S3 is larger than the width D1 of the first channel part S1. Furthermore, widths D4 and D5 of the first connecting part S4 and the second connecting part S5 are larger than the width D3 of the third channel part S3.

According to the heat dissipation devices discussed in the previous embodiments, the internal channel of the base and the extension channel of the heat dissipation fin are in fluid communication with each other, thus working fluid will naturally circulate therethrough when absorbing heat, forming a three-dimensional heat transfer over the base as well as the heat dissipation fin. As such, the overall heat dissipation efficiency is improved.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation device configured for a working fluid to flow therethrough, said heat dissipation device comprising:
   a base having at least one internal channel, a first side surface, and a second side surface, the second side surface faces away from the first side surface, the at least one internal channel includes an inlet part, an outlet part, and at least three channel parts configured for the working fluid to flow therethrough, wherein the at least three channel parts extend along a same direction and each of the at least three channel parts is located a different distance away from the first side surface;

at least one heat dissipation fin having an extension channel and an inlet and an outlet in fluid communication with the extension channel, wherein the at least one heat dissipation fin is inserted into one side of the base, the extension channel has a grid shape, and the extension channel is in fluid communication with the at least one internal channel and the outlet through the inlet; and at least one fluid replenisher in fluid communication with the at least one internal channel.

2. The heat dissipation device of claim 1, wherein the base has a recess and at least one assembling slot, the recess is located at the first side surface and is configured for accommodating a heat source, and the at least one assembly slot is located at the second surface.

3. The heat dissipation device of claim 2, wherein the at least three channel parts include a first channel part, a second channel part, and a third channel part, the at least one internal channel further includes a first connecting part, and a second connecting part, the first channel part and the third channel part are respectively in fluid communication with the inlet part and the outlet part, and two opposite ends of the second channel part are respectively in fluid communication with the first channel part and the third channel part via the first connecting part and the second connecting part, the second channel part is located closer to the first side surface than the first channel part, and the first channel part is located closer to the first side surface than the third channel part, and the at least one fluid replenisher is in fluid communication with the first channel part.

4. The heat dissipation device of claim 3, wherein extension directions of the first channel part, the second channel part, and the third channel part are different from extension directions of the first connecting part and the second connecting part.

5. The heat dissipation device of claim 4, wherein the extension directions of the first channel part, the second channel part, and the third channel part are substantially perpendicular to the extension directions of the first connecting part, and the second connecting part.

6. The heat dissipation device of claim 3, wherein a horizontal height of the second channel part is higher than a horizontal height of the first channel part, and a horizontal height of the third channel part is higher than the horizontal height of the second channel part.

7. The heat dissipation device of claim 3, wherein a width of the first channel part is larger than a width of the second channel part, and a width of the third channel part is larger than the width of the first channel part.

8. The heat dissipation device of claim 7, wherein widths of the first connecting part and the second connecting part are larger than the width of the third channel part.

9. The heat dissipation device of claim 3, wherein the base has a first surface, a second surface, and a third surface located in the recess, the first surface, the second surface, and the third surface respectively correspond to the first channel part, the second channel part, and the third channel part, two opposite sides of the second surface are respectively connected to the first surface and the second surface, the second surface is located close to the first side surface than the first surface, and the first surface is located close to the first side surface than the third surface.

10. The heat dissipation device of claim 2, wherein the second side surface has a first holding part, a second holding part, and a third holding part, two opposite sides of the second holding part are respectively connected to the first holding part and the third holding part, and the second holding part is located close to the first side surface than the first holding part, the first holding part is located close to the first side surface than the third holding part, the at least one heat dissipation fin has a hot side and a cold side located opposite to each other, the hot side has a first part, a second part, and a third part, and the first part, the second part, and the third part respectively contact the first holding part, the second holding part, and the third holding part.

11. The heat dissipation device of claim 1, wherein the at least one internal channel and extension channel are absent of capillary structure.

12. The heat dissipation device of claim 1, wherein a flow resistance of the at least one internal channel of the base is smaller than a flow resistance of the extension channel of the at least one heat dissipation fin.

13. The heat dissipation device of claim 1, wherein a fluid pressure in the extension channel of the at least one heat dissipation fin is larger than a fluid pressure in the at least one internal channel of the base.

\* \* \* \* \*